United States Patent
Hsieh

(10) Patent No.: US 6,472,265 B1
(45) Date of Patent: Oct. 29, 2002

(54) METHOD FOR MANUFACTURING EMBEDDED DYNAMIC RANDOM ACCESS MEMORY

(75) Inventor: Wen-Kuei Hsieh, Tainan Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/562,683

(22) Filed: May 2, 2000

(30) Foreign Application Priority Data

Mar. 9, 2000 (TW) .................................. 89104239 A

(51) Int. Cl.⁷ .......................................... H01L 21/8242
(52) U.S. Cl. ....................................... 438/241; 438/300
(58) Field of Search ................................. 438/241, 300, 438/FOR 189, FOR 196, FOR 199, FOR 212, FOR 249

(56) References Cited

U.S. PATENT DOCUMENTS

| | | | |
|---|---|---|---|
| 5,168,072 A | * | 12/1992 | Moslehi |
| 5,677,214 A | * | 10/1997 | Hsu |
| 5,683,924 A | * | 11/1997 | Chan et al. |
| 5,691,212 A | * | 11/1997 | Tsai et al. |
| 6,100,145 A | * | 8/2000 | Kepler et al. |
| 6,190,976 B1 | * | 2/2001 | Shishiguchi et al. |
| 6,190,977 B1 | * | 2/2001 | Wu |

* cited by examiner

*Primary Examiner*—George Fourson
(74) *Attorney, Agent, or Firm*—J.C. Patents

(57) ABSTRACT

A method of manufacturing an embedded DRAM. A substrate has a memory cell region and a logic circuit region. A plurality of gate conductors are formed on the substrate in the memory cell region and the logic circuit region. A spacer is formed on a sidewall of each gate conductor. An epitaxy layer is formed selectively on the exposed area of the substrate surface to service as source/drain regions in the logic circuit region and a source region and a drain region in the memory cell region. A silicide layer is formed on the epitaxy layer. A conformal buffer layer is formed over the substrate, and then a dielectric layer is formed over the substrate to cover the gate conductors. A mask is formed on the dielectric layer to expose a DRAM cell bit line contact region and a logic device source/drain contact region at the same time. A first etching step is performed to remove the dielectric layer by using the barrier layer as an etching stop layer. Then, a second etching step is performed to remove the barrier layer for exposing the silicide layer. As a result, a DRAM cell bit line contact and a logic device source/drain contact in the memory cell region and in the logic circuit region are formed at the same time by using the first etching step and the second etching step. Finally, metal plugs are formed within the DRAM cell bit line contact and the logic device source/drain contact simultaneously.

28 Claims, 5 Drawing Sheets

METHOD FOR MANUFACTURING EMBEDDED DYNAMIC RANDOM ACCESS MEMORY

CROSS-REFERENCE TO RELATED APPLICATION

This application claims the priority benefit of Taiwan application serial no. 89104239, filed Mar. 9, 2000.

BACKGROUND OF THE INVENTION

1. Field of Invention

The present invention relates to a method for manufacturing a semiconductor. More particularly, the present invention relates to a method for manufacturing an embedded dynamic random access memory (DRAM).

2. Description of Related Art

In order to decrease the semiconductor manufacturing cost and simplify the fabrication procedures, a method for putting memory cell and logic circuit devices together on a semiconductor chip is developed. The structure integrating a logical device and a memory device on the same wafer is called system on chip (SOC).

Typically, an embedded DRAM comprises a memory device region and a logic circuit region. The memory devices and the logic devices are together formed on the same wafer. The benefits of the embedded DRAM include high yield, short cycle time and low manufacturing cost. However, the specificity requirements of the memory devices and the logic devices are different from each other, so that the process procedures for manufacturing the embedded DRAM must be modified to fit those requirements. Taking the logic device as an example, the logic device requires relatively high operation rate. On the other hand, the refreshing time of memory capacitors must be as long as possible. Therefore, the memory transistors must be fabricated in a manner slightly different from the logic devices.

FIG. 1 is a schematic cross-sectional view showing a portion of a conventional embedded DRAM with both logic devices and memory cell transistors therein.

As shown in FIG. 1, a substrate 100 that includes a logic circuit region 102 and a memory cell region 104 is provided. A DRAM is formed in the memory cell region 104, wherein the DRAM includes three transistors 108, 110, 112 and a capacitor (not shown). A transistor 106 is formed in the logic circuit region 102. The gate conductors of the transistors 106, 108, 110 and 112 consist of polysilicon layer, tungsten silicide layer and silicon nitride layer from the bottom to the top of the gate conductors in sequence.

When integration of elements in integrated circuits (IC) increases, line widths and geometries for semiconductor devices are reduced. However, source/drain region resistance in metal oxide semiconductor (MOS) transistors simultaneously increases, and the polysilicon electrodes that form the MOS gates and wiring lines within semiconductor devices introduce undesirable resistance. In order to reduce resistance and RC delay time to improve the operating speed of a device, a self-aligned silicide (salicide) process is employed, and to reduce the sheet resistance of the source/drain regions in order to preserve the integrity of shallow junctions between the metal layer and the MOS transistor. Therefore, a response time or an operating speed of the whole device is increased by reducing the gate resistance and the junction resistance.

Traditionally, a buffer layer is conformal formed over the substrate 100. Then, a mask layer is formed on the buffer layer in the memory cell region 104 to expose the buffer layer in the logic circuit region 102. Next, the buffer layer in the logic circuit region 102 is removed to expose a portion of the substrate 100. Subsequently, a self-aligned silicide process is performed to form a silicide layer 118 on the surface of source/drain regions 114 in the logic circuit region 102.

In order for the memory cell device to be reliable, and the logic circuit device to have high performance. To increase the speed of operation of the transistor 106 in the logic circuit region 102, self-aligned silicide layers 118 are formed on the source/drain regions 114 of the transistor 106. However, in order to extend the refreshing period of DRAM in the memory cell region 104, resistance at the junction between the capacitor in DRAM and the source/drain region 116 of the transistors 108, 110 and 112 must be increased. Consequently, a silicide layer is usually not formed over the source/drain regions of the transistors 108, 110 and 112 in the memory cell region 104 to avoid junction leakage between the capacitor in DRAM and the source/drain region 116 of the transistors 108, 110 and 112.

Hence, in general, before self-aligned silicide layers are formed on the source/drain regions of the transistor in the logic circuit region, it is necessary to additionally form a barrier layer such as a silicon nitride layer over the wafer. Then, a mask is used to separate the Logic region and DRAM region. The barrier layer in the logic circuit region is removed, and then a silicide layer is formed in the logic circuit region. Finally, the mask and the barrier layer are removed after the self-aligned silicide process is complete.

After the mask layer and the barrier layer are removed, poly plug and tungsten plug are respectively formed on the substrate 100 in the memory cell region 104 and the logic circuit region 102. The poly plug and tungsten plug are connected with the source/drain region 116 in the memory cell region 104 and the source/drain regions 114 in the logic circuit region 102, respectively.

Because the doped concentration of the source/drain regions in DRAM is low, it cannot generate good ohmic contact if tungsten plug is used. Therefore, doped poly plug is generally used to contact with the source/drain regions in the DRAM. However, contact resistance formed thereon is slightly higher, lower resistance can be formed if tungsten plugs are used both in DRAM and logic circuit region. Consequently, the contact resistance in the DRAM is reduced and the manufacturing steps are simplified.

Ideally, silicide layers are formed over the source/drain regions 116 of transistors in the memory cell region as well as the source/drain regions 114 of transistors in the logic device region, wherein the silicide layer formed on the source/drain regions 116 of transistors in the memory cell region does not induce junction leakage increase. However, such a configuration can hardly be achieved through a conventional process.

SUMMARY OF THE INVENTION

The invention provides a method of manufacturing an embedded DRAM. It can form silicide layers in memory cell region and logic circuit region that does not induce junction leakage increase and can use W-plug in both memory cell region and logic circuit region.

The invention provides a method of manufacturing an embedded DRAM. A substrate having a memory cell region and a logic circuit region is provided. A capacitor in the memory cell region can be a deep trench capacitor formed within the substrate or a stack capacitor formed over the substrate after MOS transistors are formed. However, the capacitor process is not described herein since it is not strongly related to the scope of the present invention.

A plurality of isolation structures are formed in the substrate to define active regions, and then a gate dielectric is formed on the substrate. Next, a doped polysilicon layer is formed over the substrate, wherein the polysilicon layer can be doped by either in-situ $n^+$ type ions doping or $n^+/p^+$ dual implantation. Subsequently, a silicide layer and a cap layer are formed on the doped polysilicon layer in sequence.

The cap layer, the silicide layer, the doped polysilicon layer and the gate dielectric are defined by reactive ion etch (RIE) to form a plurality of gate conductors on the substrate in the memory cell region and the logic circuit region. After the gate conductors are formed, a thermal oxidation step is performed to recover the gate dielectric damage due to reactive ion etch. Then, LDD implant is followed if necessary.

A spacer is formed on a sidewall of each gate conductors. Then, after surface clean, an undoped Si selective epitaxy is formed selectively on the exposed area of the substrate surface to service as source/drain regions in the logic circuit region and a source region and a drain region in the memory cell region. Thereafter, an ion implantation process, in which n-type and p-type ions having high concentration are implanted into the undoped Si selective epitaxy, is performed. Next, a silicide layer is formed on the surface of the source/drain regions in the logic circuit region and the surface of the source region and the drain region in the memory cell region. A barrier layer is formed over the substrate, and then a dielectric layer is formed over the substrate.

A mask is formed on the dielectric layer, wherein the mask is used to expose a DRAM cell bit line contact region and logic device source/drain contact region at the same time. A two-step etching process that contains a first etching step and a second etching step is performed to form a DRAM cell bit line contact and a logic device source/drain contact. The first etching step is performed by using the barrier layer as an etching stop layer to remove the dielectric layer, and then the second etching step is performed to remove the barrier layer and to expose the salicide layer. The first etching step and the second etching step are combined to form a DRAM cell bit line contact in the memory cell region and a logic device source/drain contact in the logic circuit region. Furthermore, one mask formed on the dielectric layer is used to expose a gate conductor contact region. Then, an etching process is performed to form a gate conductor contact.

Finally, metal plugs are formed in the DRAM cell bit line contact, the logic device source/drain contact and the gate conductor contact simultaneously. Then, an embedded DRAM according to this invention is completed by conventional method.

The feature of this invention is that the epitaxy layer is formed on the substrate to serve as source/drain regions in the logic circuit region and a source region and a drain region in the memory cell region, and thus the silicide layer is simultaneously formed on the source/drain regions in the logic circuit region and the source region and the drain region in the memory cell region. Therefore, not only the operation performances of the logic circuit device and the memory device can be greatly improved, but also the occurrence of junction leakage can be avoided.

Furthermore, in the invention, the two-step etching process is performed to form the DRAM cell bit line contact and the logic device source/drain contact and to expose the salicide layer in the DRAM cell bit line contact and the logic device source/drain contact. Therefore, the loss of the silicide is prevented, and the reliability of device is maintained.

In the invention, because the two-step etching process is performed to form the DRAM cell bit line contact and the logic device source/drain contact, which contacts expose the salicide layer, the metal plugs are formed both in the DRAM cell bit line contact and in the logic device source/drain contact. Therefore, the manufacture steps are simplified.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2D are schematic, cross-sectional views of the process for manufacturing an embedded DRAM according to one preferred embodiment of this invention.

Figure 1:
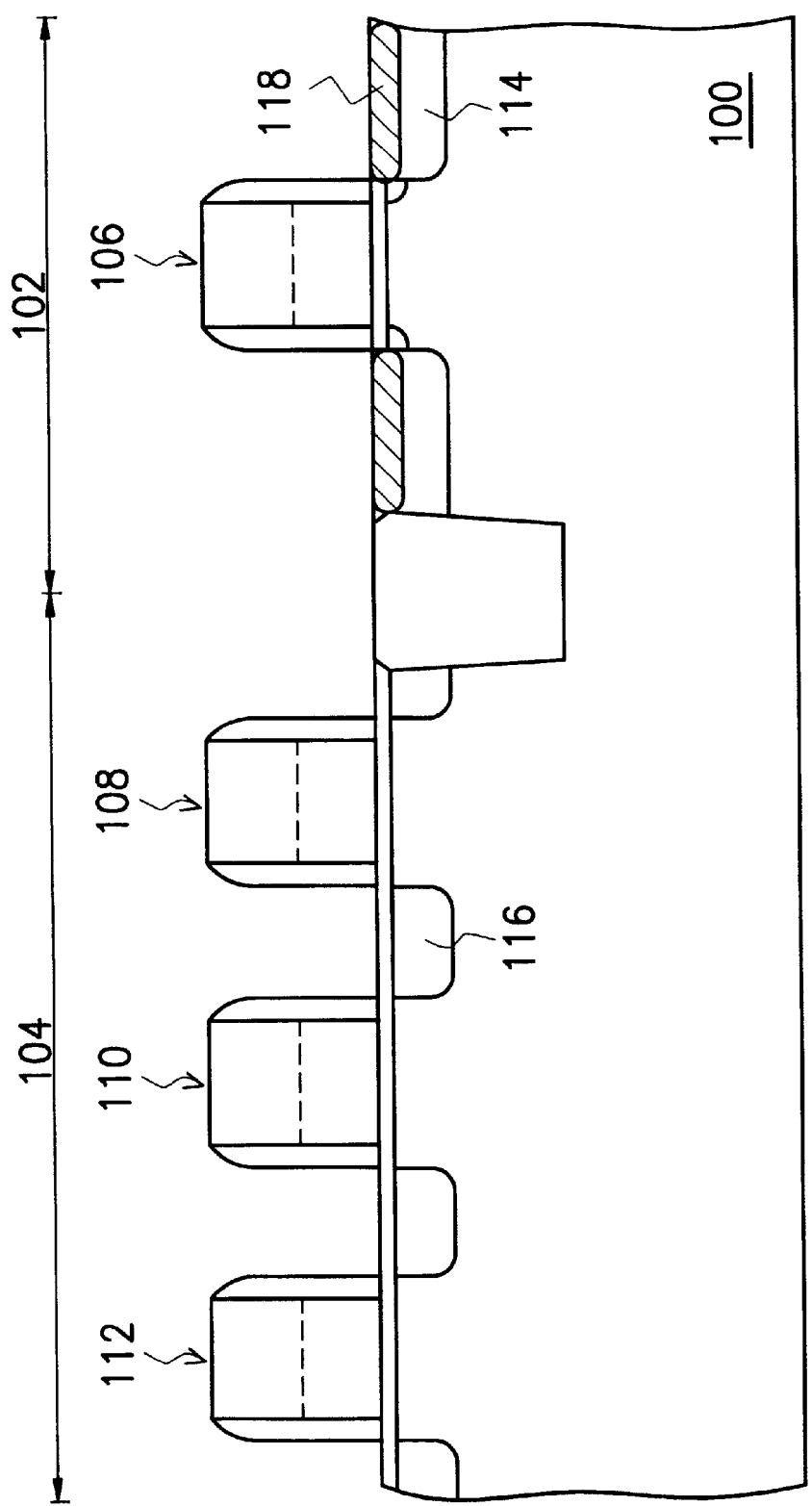
FIG. 1 is a schematic cross-sectional view showing a portion of a conventional embedded DRAM with both logic devices and memory cell transistors therein.
Figure 2A:
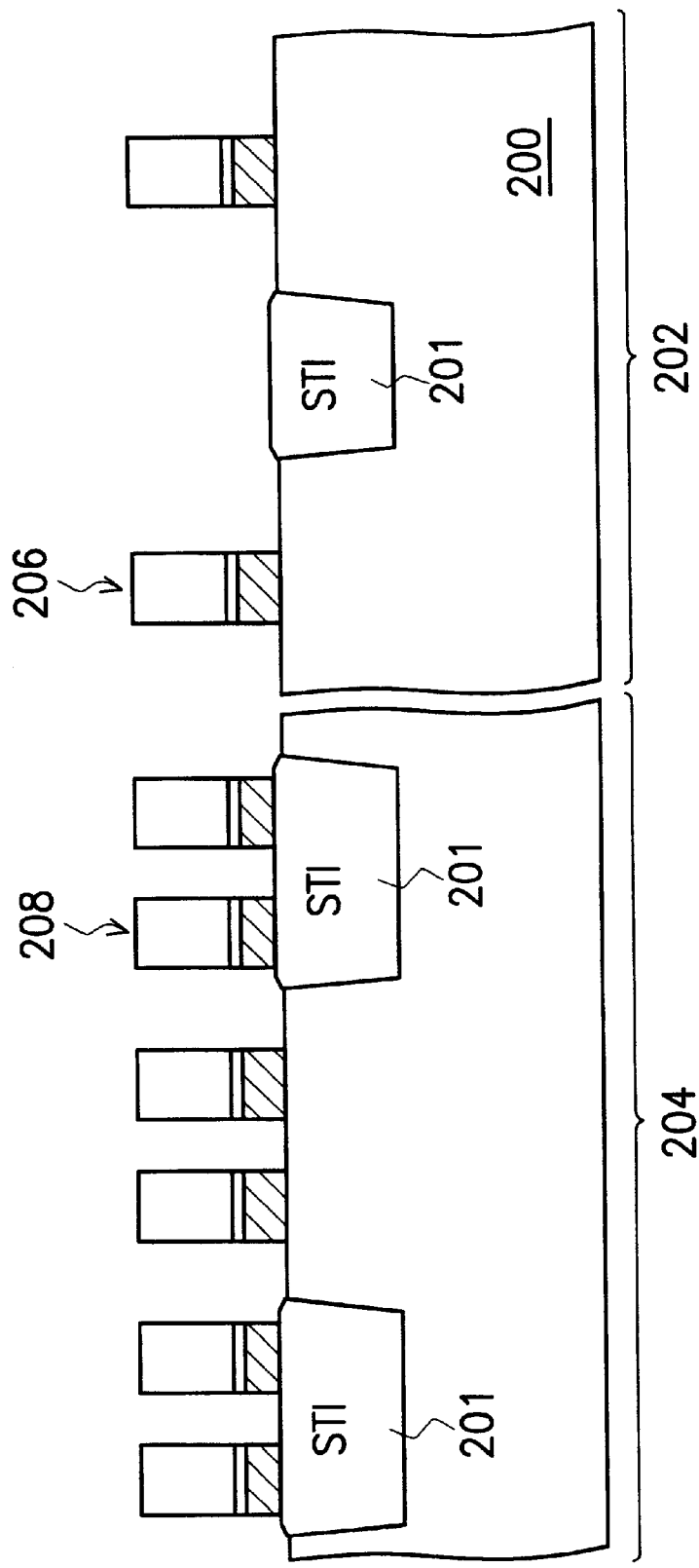
FIGS. 2A through 2D are schematic, cross-sectional views of the process for manufacturing an embedded DRAM according to one preferred embodiment of this invention.

As shown in FIG. 2A, a substrate 200 having a plurality of isolation structure 201, a logic circuit region 202 and a memory cell region 204 is provided. The logic circuit device and memory cell are formed in the logic circuit region 202 and a memory cell region 204, respectively. A plurality of gate conductors 206 and 208 are formed on the substrate 200 in the logic circuit region 202 and memory cell region 204, respectively. Notably, the spaces between the gate conductors 206 formed in the logic circuit region 202 are larger than those between the gate conductors 208 formed in the memory cell region 204.

The method for forming the gate conductors 206 and 208 includes the following steps. First, the isolation structures 201 are formed to define active regions, wherein the isolation structure 201 can be a shallow trench isolation structure. Then, a gate dielectric is formed by, for example, thermal oxidation on the substrate 200, wherein the gate dielectric can be a gate oxide layer. Next, a doped polysilicon layer is formed over the gate dielectric, wherein the polysilicon layer can be doped by either in-situ $n^+$ type ions doping or $n^+/p^+$ dual implantation. Subsequently, a silicide layer and a cap layer are formed on the doped polysilicon layer in sequence, wherein the silicide layer can be a tungsten silicide layer ($WSi_x$) and the cap layer can be a silicon nitride layer.

Then, the cap layer, the silicide layer, the doped polysilicon layer and the gate dielectric are defined by reactive ion etch (RIE) to form a plurality of gate conductors 206, 208 on the substrate 200 in the memory cell region 204 and the logic circuit region 202. The gate conductors 206 and 208 comprise a polysilicon layer, a polycide layer and a nitride cap layer from the bottom to the top of the gate conductors 206 and 208 in sequence, wherein the silicide layer is used to improve the resistant of the poly gate conductor.

Furthermore, a capacitor (not shown) in the memory cell region 204 can be a deep trench capacitor formed within the substrate 200 or a stack capacitor formed over the substrate 200 after MOS transistors are formed. However, the capacitor process is not described herein since it is not strongly related to the scope of the present invention and it is well known to those skilled in the art.

After the gate conductors 206 and 208 are formed, a thermal oxidation step is performed to recover the gate dielectric damage due to reactive ion etch (RIE). Then, LDD implant is followed if necessary.

Figure 2B:
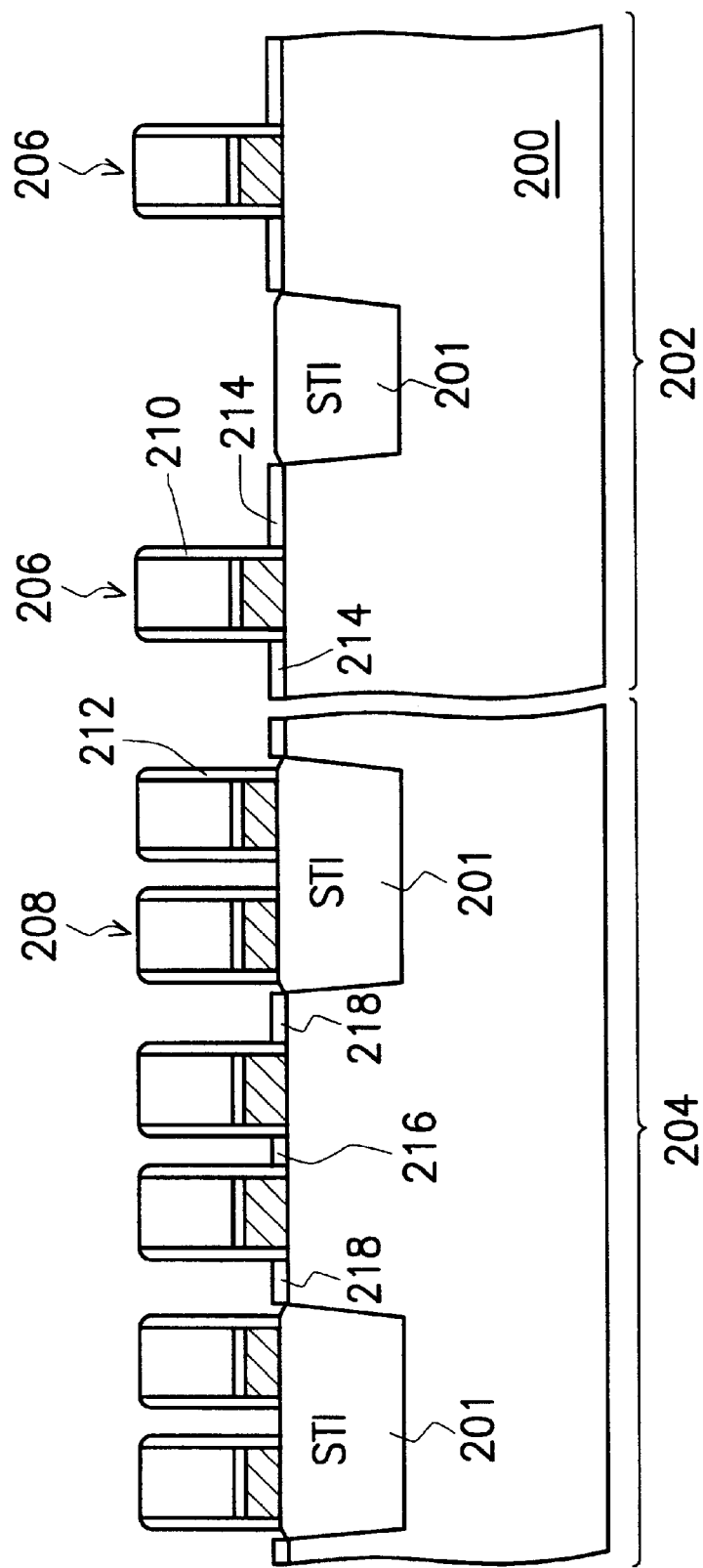

As shown in FIG. 2B, spacers 210 and 212 are formed on a sidewall of each gate conductors 206 and 208 at the same time. Then, after surface clean, an undoped Si selective epitaxy is formed selectively on the exposed area of the substrate 200 surface to service as source/drain regions 214 in the logic circuit region 202 and a source region 216 and a drain region 218 in the memory cell region 204. For example, the undoped Si selective epitaxy can be formed by a low-temperature selective epitaxial technique, such as using a gas mixture of monosilene ($SiH_4$), hydrogen ($H_2$), and chlorine ($Cl_2$) at about 600° C. with a pressure of about 1 Torr. Preferably, the thickness of the undoped Si selective epitaxy is about 500–800 Å.

Subsequently, a $N^+$ mask is used to expose the NMOS surface/drain regions for $N^+$ implant. The N-type dopants such as arsenic ions are implanted into the undoped Si selective epitaxy to enhance conductivity of the source/drain regions 214 in the logic circuit region 202 and the source region 216 and the drain region 218 in the memory cell region 204. In this invention, there is no difference between the DRAM array device with the peripheral and logic devices. The dosage of N-type dopants is about 1–3E15 ions/$com^3$ and the implantation energy of N-type dopants is about 45–75 KeV.

Next, a $P^+$ mask is used to expose the PMOS surface/drain regions for $P^+$ implant. The P-type dopants such as boron ions (e.g. $BF_2$) are implanted into the undoped Si selective epitaxy to enhance conductivity of the source/drain regions 214 in the logic circuit region 202 and the source region 216 and the drain region 218 in the memory cell region 204. The dosage of P-type dopants is about 1–3E15 ions/$cm^2$ and the implantation energy of P-type dopants is about 30–50 KeV.

However, with the reduction of dimensions of device, the formation of a high-quality silicide layer on the silicon device becomes difficult. Growth of the silicide layer is stunted by the high stress between the silicide layer and the polysilicon layer and/or the small number of nucleation sites. Therefore, quality of the silicide layer deteriorates, sheet resistance of the silicide layer increases, and performance of the device is compromised. For the formation of a device whose line width is smaller than 0.18 $\mu$m, a pre-amorphization implant (PAI) process is performed to improve the quality of the silicide layer because the PAI process converts the surface of the polysilicon layer and the source/drain regions into an amorphous silicon layer in order to increase the number of the nucleation sites. Therefore, the quality of the subsequently formed silicide layer is improved, and sheet resistance of the subsequently formed silicide layer is reduced.

Figure 2C:
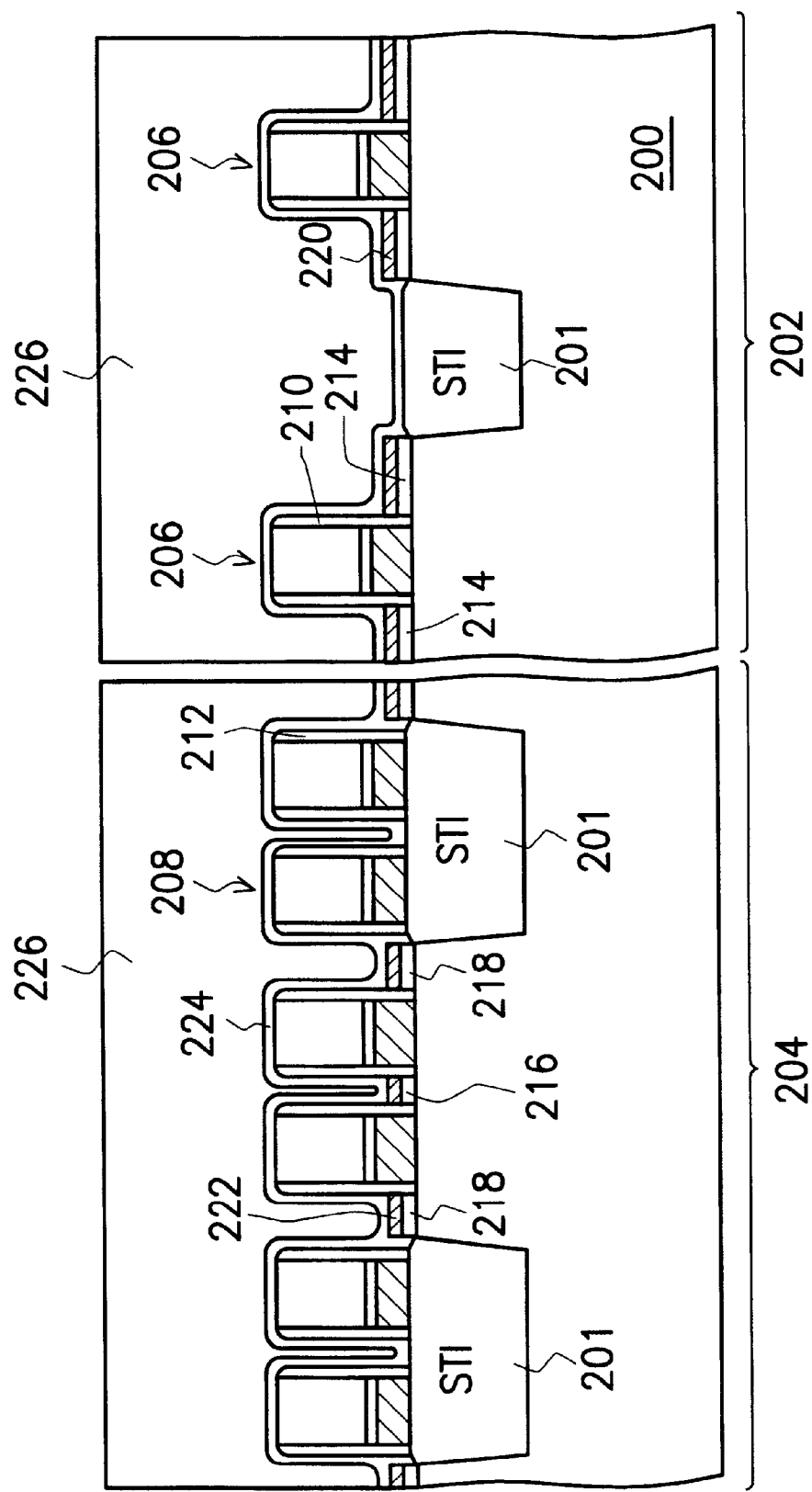

As shown in FIG. 2C, a pre-amorphization implant process is carried out to implant ions into the source/drain regions 214 in the logic circuit region 202 and the source region 216 and the drain region 218 in the memory cell region 204, so that a surface layer of the source/drain regions 214 in the logic circuit region 202 and the source region 216 and the drain region 218 in the memory cell region 204 are converted into an amorphous silicon layer (not shown in FIG. 2C). The pre-amorphization implant process bombards the surface of the source/drain regions 214 in the logic circuit region 202 and the source region 216 and the drain region 218 in the memory cell region 204 to form an amorphous silicon layer; thus, the number of the nucleation sites is increased. As a result, the quality of a subsequently formed silicide layer on the surface of the source/drain regions 214 in the logic circuit region 202 and the source region 216 and the drain region 218.in the memory cell region 204 is improved. The amorphization of the source/drain regions facilitates the formation of a silicide layer in the subsequent process.

Preferably, the pre-amorphization implant process with arsenic ions ($As^+$) is performed on the surface of the source/drain regions 214 in the logic circuit region 202 and the source region 216 and the drain region 218 in the memory cell region 204, wherein the dosage of the arsenic ions is about 2–10E13 ions/$cm^2$ and the energy of the arsenic ions is about 30–50 KeV.

Subsequently, a conformal metal layer (not shown in FIG. 2C) of about 150–300 Å is deposited over the substrate 200 by, for example, sputtering. Preferably, the metal layer can be made of refractory metal. Suitable refractory metals include titanium and cobalt, for example.

A portion of the metal layer reacts with the silicon in the source/drain regions 214 in the logic circuit region 202 and the source region 216 and the drain region 218 in the memory cell region 204 by a rapid thermal anneal (RTA) process to form a silicide layer 220 and 222.

Preferably, the rapid thermal annealing process includes two steps. A first rapid thermal annealing process is performed at a temperature of about 650–710° C. in nitrogen ($N_2$) ambient to form the silicide layer 220, 222 in the source/drain regions 214 in the logic circuit region 202 and the source region 216 and the drain region 218 in the memory cell region 204. The silicide layer 220, 222 can be a titanium silicide layer or a cobalt silicide layer, for example. Then, the portions of the metal layer not engaging the silylation are stripped away. The method for stripping away the portions of the metal layer can be a wet etching, for example. The etchant of the wet etching process preferably comprises RCA solution. Subsequently, a second rapid thermal annealing process is performed at a temperature of about 800–820° C. in nitrogen ($N_2$) ambient to convert the C49-phase titanium silicide layer 220, 222 into a C54-phase titanium silicide layer 220, 222. The resistance of the C54-phase titanium silicide layer 220, 222 is lower than the resistance of the C49-phase titanium silicide layer 220, 222.

Next, a conformal barrier layer 224 is formed over the substrate 200 to cover the gate conductors 206, 208 and the silicide layer 220, 222. The buffer layer 224 can be a silicon nitride layer formed by chemical vapor deposition (CVD) or conventional method, for example. Preferably, the thickness of the buffer layer 224 is about 200–350 Å.

Next, a dielectric layer is formed over the substrate 200 to cover the gate conductors 206, 208. The dielectric layer can be formed from borophosphosilicate glass (BPSG) by CVD, for example. Then, a planarization process such as chemical mechanical polishing (CMP) is performed on the dielectric layer to form a planarized dielectric layer 226.

Figure 2D:
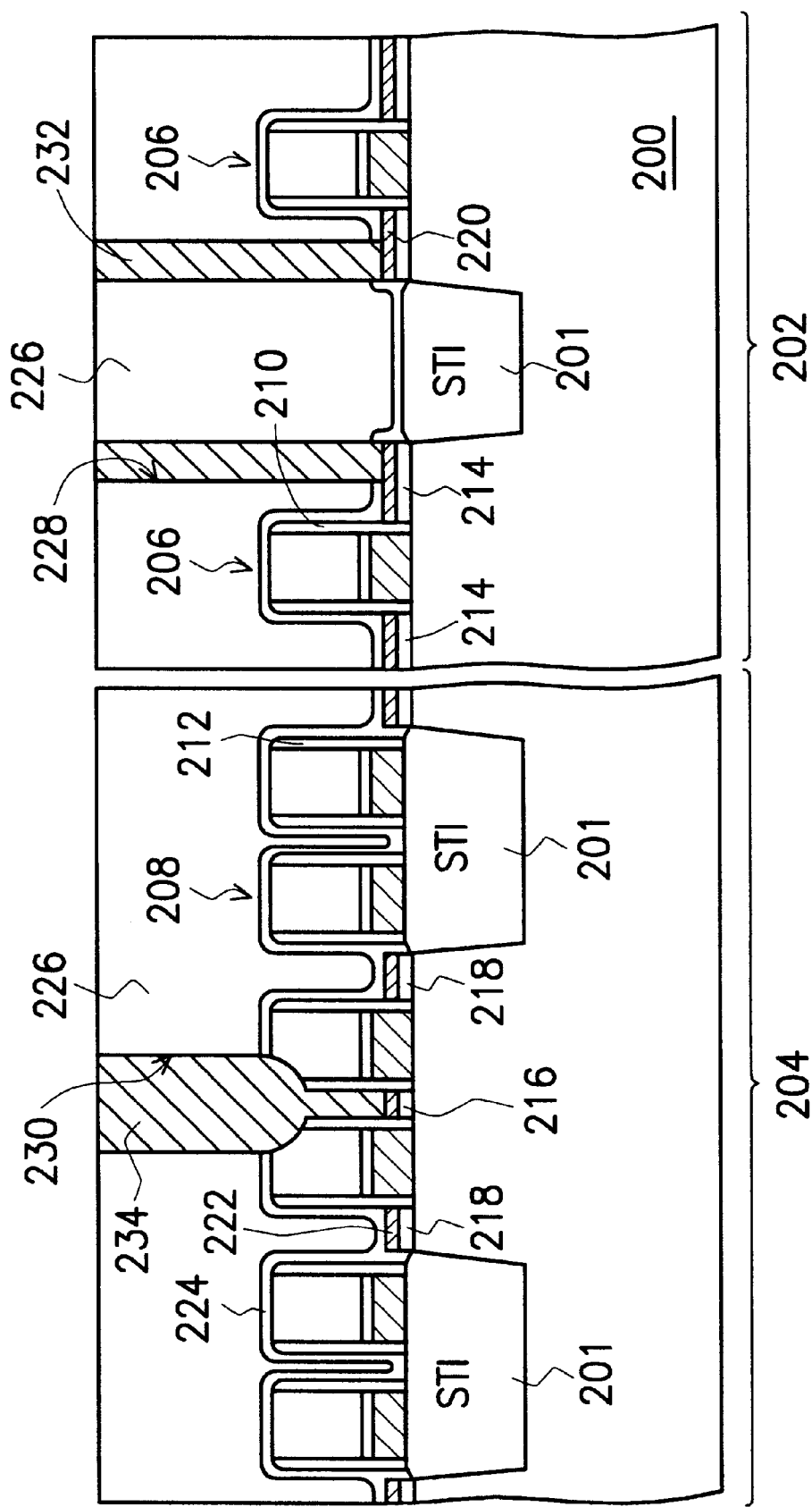

As shown in FIG. 2D, a mask (not shown) is formed on the dielectric layer 226, wherein the mask is used to expose a predetermined DRAM cell bit line contact region and logic device source/drain contact region at the same time. A two-step etching process that contains a first etching step and a second etching step is performed to form a DRAM cell bit line contact 230 and a logic device source/drain contact 228. The first etching step is performed to remove the dielectric layer 226 by using the barrier layer 224 as an etching stop layer. Then, the second etching step is performed to remove the barrier layer 224 until the silicide layers 220, 222 are exposed. The first etching step and the second etching step are combined to form the DRAM cell bit line contact 230 in the memory cell region 204 and the logic device source/drain contact 228 in the logic circuit region 202 simultaneously. Furthermore, one mask (not shown in FIG. 2D) formed on the dielectric layer 226 is used to expose a gate conductor contact region. Then, an etching process is performed to etch the dielectric layer 226 by using the $WSi_x$ of the gate conductors 206, 208 as an etching stop layer to form a gate conductor contact (not shown).

Finally, a conformal glue/barrier layer (not shown in FIG. 2D) of about 400 Å is formed over substrate 200 and the inner surface of the DRAM cell bit line contact 230 and a logic device source/drain contact 228. The glue/barrier layer includes, for example, Ti, Ti/TiN or Ta/TaN for a purpose to increase adhesion of the subsequently deposited metal layer or other material. Taking the Ti layer for example, after the Ti layer is deposited by chemical vapor deposition (CVD), a RTA process at about 550° C. in ($H_2+N_2$) ambient is performed.

A metal layer is formed on the substrate 200 and in the DRAM cell bit line contact 230, the logic device source/drain contact 228 and the gate conductor contact. The metal layer is made of, for example, tungsten, is formed by CVD using tungsten fluoride ($WF_6$) as a main gas source, at a temperature of about 415–445° C. with a thickness of about 4000 Å. Then, a portion of the metal layer other than the DRAM cell bit line contact 230, the logic device source/drain contact 228 and the gate conductor contact is removed by, for example, etching back or CMP to form metal plugs 232, 234 in the logic device source/drain contact 228 and the DRAM cell bit line contact 230 simultaneously. Meanwhile, a metal plug (not shown) is formed in the gate conductor contact. Then conventional processes are followed to complete the structure of embedded DRAM.

Because the conventional W-CVD has good step coverage ability, tungsten layer deposited by chemical vapor deposition is commonly used as a plug in very large scale integration (VLSI). Additionally, in the invention, the W-plugs are formed in both the DRAM cell bit line contact and the logic device source/drain contact. Therefore, the operating speed of device is improved and the manufacture steps of this invention can be simplified.

Furthermore, in the invention, the two-step etching process is performed to form the DRAM cell bit line contact and the logic device source/drain contact and to expose the salicide layer in the DRAM cell bit line contact and the logic device source/drain contact. Therefore, the loss of the silicide is prevented, and the reliability of device is maintained.

In this invention, the epitaxy layer is formed on the substrate to serve as source/drain regions in the logic circuit region and a source region and a drain region in the memory cell region, and thus the silicide layer is simultaneously formed on the source/drain regions in the logic circuit region and the source region and the drain region in the memory cell region. Therefore, not only the operation performances of the logic circuit device and the memory device can be greatly improved, but also the occurrence of junction leakage can be avoided.

Altogether, the invention includes the following advantages:

1. In the invention, the epitaxy layer is formed on the exposed substrate to serve as source/drain regions in the logic circuit region and a source region and a drain region in the memory cell region, and thus the silicide layer is simultaneously formed on the source/drain regions in the logic circuit region and the source region and the drain region in the memory cell region. Therefore, not only the operation performances of the logic circuit device and the memory device can be greatly improved, but also the occurrence of junction leakage can be avoided.

2. In the invention, because the two-step etching process is performed to form the DRAM cell bit line contact and the logic device source/drain contact, which contacts expose the salicide layer, the metal plugs are formed both in the DRAM cell bit line contact and in the logic device source/drain contact. Therefore, the manufacture steps are simplified.

3. In the invention, the two-step etching process is performed to form the DRAM cell bit line contact and the logic device source/drain contact and to expose the salicide layer in the DRAM cell bit line contact and the logic device source/drain contact. Therefore, the loss of the silicide is prevented, and the reliability of device is maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an embedded DRAM, which is suitable for a substrate having a memory cell region and a logic circuit region, wherein a plurality of gate conductors are formed on the substrate in the memory cell region and the logic circuit region, and a spacer is formed on a sidewall of each gate conductor, the method comprising:

forming an epitaxy layer on the exposed substrate to serve as source/drain regions in the logic circuit region and a source region and a drain region in the memory cell region;

forming a silicide layer on the source/drain regions in the logic circuit region and the source region and the drain region in the memory cell region;

forming a conformal barrier layer over the substrate;

forming a dielectric layer over the substrate to cover the gate conductors;

performing a first etching step to remove a portion of the dielectric layer over the silicide layer to form a plurality of contact openings using the barrier layer as an etching stop layer;

performing a second etching step to remove a portion of the barrier layer until a portion of the silicide layer is exposed; and forming a plurality of metal plugs in the contact openings.

2. The method of claim 1, wherein the substrate includes a trench capacitor in the memory cell region.

3. The method of claim 1, wherein the gate conductors comprise a polysilicon layer, a silicide layer and a cap layer in sequence.

4. The method of claim 1, wherein the step of forming the epitaxy layer further comprises:

forming an undoped Si selective epitaxy selectively on the exposed area of the substrate;

performing a first-type ion implantation step with a first mask; and performing a second-type ion implantation step with a second mask, wherein electrical property of the second-type ion is inverse to the electrical property of the first-type ion.

5. The method of claim 4, wherein the undoped Si selective epitaxy is formed by a low-temperature selective epitaxial technique using a gas mixture of monosilane ($SiH_4$), hydrogen ($H_2$), and chlorine ($Cl_2$) at about 600° C. with a pressure of about 1 Torr.

6. The method of claim 4, wherein the thickness of the undoped Si selective epitaxy is about 500–800 Å.

7. The method according to claim 4, wherein the first-type implantation step is performed using arsenic ions, wherein the dosage of the arsenic ions is about 1–3E15 ions/$cm^2$ and the energy of the arsenic ions is about 45–75 KeV.

8. The method according to claim 4, wherein the second-type implantation step is performed using boron fluoride ($BF_2$), wherein the dosage of the $BF_2$ is about 1–3E15 ions/$cm^2$ and the energy of the $BF_2$ is about 30–50 KeV.

9. The method of claim 1, wherein the substrate further comprises a plurality of isolation structures.

10. The method of claim 1, wherein the silicide layer is made of titanium silicide.

11. The method of claim 1, wherein the silicide layer is made of cobalt silicide.

12. The method of claim 1, wherein the buffer layer is made of silicon nitride.

13. The method of claim 1, wherein the dielectric layer is made of BPSG.

14. The method of claim 1, wherein the metal plugs include tungsten plugs.

15. A method of manufacturing an embedded DRAM, which is suitable for a substrate having a memory cell region and a logic circuit region, wherein a plurality of gate conductors are formed on the substrate in the memory cell region and the logic circuit region, and a spacer is formed on a sidewall of each gate conductor, the method comprising:

forming an epitaxy layer on the exposed substrate to serve as source/drain regions in the logic circuit region and a source region and a drain region in the memory cell region;

forming a silicide layer on the source/drain regions in the logic circuit region and the source region and the drain region in the memory cell region simultaneously;

forming a conformal barrier layer over the substrate;

forming a dielectric layer over the substrate to cover the gate conductors;

performing an etching step to remove a portion of the dielectric layer and a portion of the barrier layer over the silicide layer until a portion of the silicide layer is exposed to form a plurality of contact openings; and forming a plurality of metal plugs in the contact openings.

16. The method of claim 15, wherein a stacked capacitor is formed over the substrate in the memory region.

17. The method of claim 15, wherein the gate conductors comprise a polysilicon layer, a silicide layer and a cap layer in sequence.

18. The method of claim 15, wherein the step of forming the epitaxy layer further comprises:

forming an undoped Si selective epitaxy selectively on the exposed area of the substrate;

performing a first-type ion implantation step with a first mask; and performing a second-type ion implantation step with a second mask, wherein electrical property of the second-type ion is inverse to the electrical property of the first-type ion.

19. The method of claim 18, wherein the undoped Si selective epitaxy is formed by a low-temperature selective epitaxial technique using a gas mixture of monosilane ($SiH_4$), hydrogen ($H_2$), and chlorine ($Cl_2$) at about 600° C. with a pressure of about 1 Torr.

20. The method of claim 18, wherein the thickness of the undoped Si selective epitaxy is about 500–800 Å.

21. The method according to claim 18, wherein the first-type implantation step is performed using arsenic ions, wherein the dosage of the arsenic ions is about 1–3E15 ions/$cm^2$ and the energy of the arsenic ions is about 45–75 KeV.

22. The method according to claim 4, wherein the second-type implantation step is performed using boron fluoride ($BF_2$), wherein the dosage of the $BF_2$ is about 1–3E15 ions/$cm^2$ and the energy of the $BF_2$ is about 30–50 KeV.

23. The method of claim 15, wherein the silicide layer is made of cobalt silicide.

24. The method of claim 15, wherein the silicide layer is made of titanium silicide.

25. The method of claim 15, wherein the buffer layer is made of silicon nitride.

26. The method of claim 15, wherein the dielectric layer is made of BPSG.

27. The method of claim 15, wherein the etching step further comprising:

performing a first etching to remove a portion of the dielectric layer using the barrier layer as an etching stop layer to form a plurality of contact openings; and performing a second etching step to remove a portion of the barrier layer exposing a portion of the silicide layer.

28. The method of claim 15, wherein the metal plugs include tungsten plugs.

* * * * *